July 14, 1964 J. PHILIPS 3,141,119

HYPERCONDUCTIVE TRANSISTOR SWITCHES

Filed March 28, 1957 2 Sheets-Sheet 1

WITNESSES:

Bernard R. Giegucy

Wm. B. Sellers.

INVENTOR
John Philips

BY

Frederick Shapoe
ATTORNEY

July 14, 1964 J. PHILIPS 3,141,119

HYPERCONDUCTIVE TRANSISTOR SWITCHES

Filed March 28, 1957 2 Sheets-Sheet 2

United States Patent Office 3,141,119
Patented July 14, 1964

3,141,119

HYPERCONDUCTIVE TRANSISTOR SWITCHES

John Philips, Pittsburgh, Pa., assignor to Westinghouse Electric Corporation, East Pittsburgh, Pa., a corporation of Pennsylvania Filed Mar. 28, 1957, Ser. No. 649,038
1 Claim. (Cl. 317—235)

The invention relates generally to semiconductor transistor switches and more particularly to semiconductor transistor switches with bistable collector characteristics.

The object of the invention is to provide a semiconductor transistor switch that will respond to small control currents to perform switching operations involving relatively large currents.

It is also an object of the invention to provide a semiconductor switch, the switching function of which can be controlled from the maximum voltage that can be applied across the collector junction without breakdown to about one volt by varying the control current delivered to the base element of the transistor switch.

Other objects of the invention will, in part, be obvious and will, in part, appear hereinafter.

The invention accordingly comprises an article of manufacture possessing the features, properties and the relation of elements which will be exemplified in the article hereinafter described and the scope of the application of which will be indicated in the claims.

For a fuller understanding of the nature and objects of the invention, reference should be had to the following detailed description taken in connection with the accompanying drawing, in which.

Figures 1, 2:
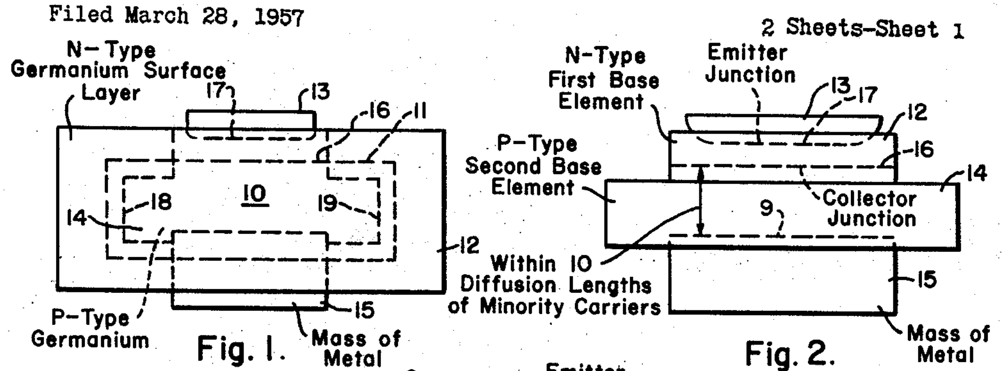
FIGURE 1 is an enlarged view in side elevation of a semiconductor crystal blank after it has been partly processed to add elements required to make a complete operable unit.
FIG. 2 is an enlarged view in side elevation of the semiconductor blank illustrated in FIG. 1 processed further to remove parts to make a finished transistor switch unit.

The transistor devices of the present invention comprise either a PNP or an NPN structure, with an associated mass-of-metal attached to one of the zones having P-type conductivity in the former, or to one of the zones having N-type conductivity in the latter structure, and a base contact ohmically affixed to the intermediate zone in either structure. Electrical leads are connected to the first conductivity zones (i.e. the one furtherest removed from the mass of metal) in either type of structure, to the base contact and to the mass of metal.

The semiconductor transistor switch of this invention functions in a unique manner. As is typified by the circuit of FIG. 4, if a reverse potential is applied to a circuit between the mass of metal and the first conductivity zone with no voltage being applied to the base contact, the semiconductor transistor will be so highly resistant that up to a predetermined point, less than a milliampere of current will flow even at substantial voltage. However, as the negative voltage is increased, there is reached a point at which a critical current and voltage is applied and the semiconductor transistor device will suddenly become hyperconductive so that a potential of approximately one volt will sustain a high current of up to 10 amperes. This hyperconductive point may be varied in any particular device so as to occur at, for example, 45 volts to 150 volts reverse potential. As employed herein, the term "reverse potential" means a potential applied between the mass of metal and the first conductivity zone such that the first p-n junction adjacent to the mass of metal, i.e. collector junction 16 in FIG. 4, will be biased in the reverse direction. By applying a small biasing potential to the base contact, the hyperconductive breakdown point can be controlled so as to occur at lower reverse potential and current. A biasing current of the order of from 1 to 3 milliamperes has been effective to cause hyperconductive breakdown to occur as desired. The characteristics of this switch are such that once the hyperconductive state occurs, reverse current will flow without further biasing current being applied.

The semiconductor transistor switch is generally made from a single crystal of a semiconductor material such as germanium or silicon that has been grown or drawn. The type and amount of doping of the crystal during the process of growing will depend on the semiconductor transistor switch specification to be met. If the transistor switch is to be a PNP structure, then the crystal of germanium or silicon will be doped while growing with a P-type impurity such as indium, boron or aluminum. It it is to be an NPN structure, then the germanium or silicon crystal in the process of growing will be doped with an N-type impurity such as arsenic, phosphorus or antimony. Such doping procedures are well known.

A blank or wafer is cut from the doped crystal of semiconductor material. It is desirable to cut the blank considerably larger than the finished transistor switch unit. In the process of cutting, the surface material will be disturbed to a certain extent, and it is desirable to lap and etch the blank to remove strained portions and to reduce it to the required size. The processes of lapping and etching are well known and will not be described.

Figure 3:
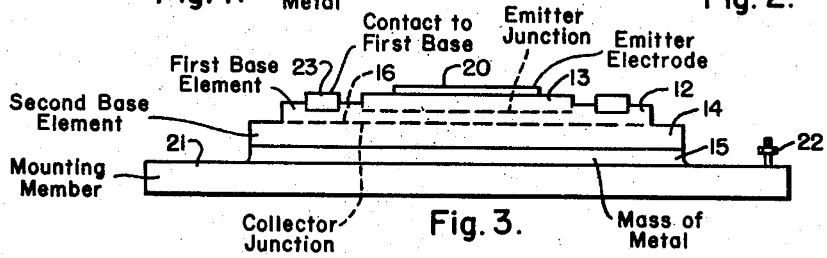
FIG. 3 is an enlarged view in side elevation of a transistor switch embodying the features of the invention.

Referring now to FIGS. 1 to 3 of the drawing, there are illustrated progressive stages in the preparation and fabrication of the semiconductor transistor switch of this invention wherein a doped semiconductor wafer or blank 10 is treated by an alloying and diffusion process to apply certain elements, the construction and function of which will be described in detail hereinafter.

Assume now that the embodiment to be described is a PNP semiconductor transistor switch and that the blank 10, which has been prepared to size, is germanium doped with a P-type impurity such as aluminum, then in order to provide a base element 12, a surface portion or layer of the blank 10 will be doped with an N-type impurity, such as arsenic, antimony or phosphorus. The doping of the blank 10 with an N-type impurity may be performed in any well-known manner. A satisfactory method for doping the outer layer of the blank 10 involves placing it in an evacuated chamber and, while maintaining a predetermined temperature, introducing arsenic vapor. The arsenic will diffuse into the wafer and a surface layer 12 of the blank 10 between the exterior faces and the line 11 will be so doped with an N-type impurity that the latter will become dominant over the original P-type impurity in this surface layer. It has been found that it is adequate if the arsenic penetrates to a depth of about 1 mil. Inside of line 11 a central core 14 remains P-type. The concentration of the N-type doping impurity will be heavier at the surface of the blank and will gradually decrease to the dotted line 11. A definite N-type zone 12, which in the final structure will be the first base element, is provided in the blank. A PN junction 16, which functions as a collector junction, exists between zone 12 and core 14.

Next, a predetermined area of the N-type surface layer 12 of the wafer will be further doped with an impurity having a P-type characteristic. A P-type doping impurity, such as aluminum, indium or gallium, may be employed. In doping with aluminum, a thin sheet of aluminum foil 13, or an aluminum alloy, may be applied to the blank and heated to a temperature required to cause it to melt, dissolve and alloy with or into the N-type zone 12. In the fusing or alloying process, care must be observed to avoid penetrating entirely through the N-type zone or first base element 12. After the alloying has been successfully completed, a P-type zone or element, which constitutes an emitter 13, will have been provided on the blank 10.

The doping with aluminum in the area of the blank 10 to which the aluminum foil is applied is so predominant that the N-type doping impurity in this area of the first base element 12 is completely overcome. However, since care has been observed not to penetrate through the first base element 12, there will still be a layer 12 of the N-type semiconductor between the emitter 13 and the P-type central core 14.

The emitter 13 has P-type characteristics and is in intimate contact with an N-type zone or area of the base element 12. Therefore, a P-N junction or emitter junction 17 is provided. By maintaining the ratios of the conductivities of those two zones in a well-known manner, the P-type emitter 13 will emit holes efficiently into the N-type base element 12 when energized.

The blank or wafer 10 now comprises a three-element structure. The emitter 13 is a P-type element, the first base 12 is an N-type element, and the central portion 14 of the blank 10, which constitutes a second base element, is P-type.

In order to make the basic unit into an effective operating semiconductor transistor switch, a mass-of-metal 15, to serve as a source of carriers, is added. The mass-of-metal 15 must be of substantial area and must be in intimate contact with the second base element 14. In order to provide for this intimate contact, the mass-of-metal is brought into contact with the blank 10, and by heating to the melting point temperature is caused to alloy with the metal of the second base 14. The alloying process is continued until the mass-of-metal 15 penetrates the N-type layer 12 on the lower surface of blank 10 as shown in FIG. 1, and makes intimate contact with the second base element 14. If desired, the N-type layer on the blank 10 where the mass-of-metal is to be applied may be first removed by cutting or etching, and the mass-of-metal 15 plated, soldered or otherwise affixed directly to the P-type semiconductor material of the second base 14.

When making a PNP semiconductor transistor switch, the mass-of-metal 15 selected should have a neutral or a P-type doping characteristic similar to that of the P-type zone constituting the second base element 14. For example, semiconductor transistor switches having indium alloyed to a second base element 14 comprising germanium doped with aluminum have operated very satisfactorily.

The function of the mass-of-metal 15 is to provide a source of minority carriers that will flow when subjected to electrical energy. In the specific embodiment of the invention described hereinbefore, indium is applied to the second base element 14 as the mass-of-metal or source of carriers. It has been found that when indium is alloyed to a germanium blank carrying P-type doping impurities, it is a very satisfactory source of minority carriers. However, it is to be understood that any other metal or alloy having a doping characteristic corresponding to the doping characteristic of the impurity in the second base element 14 may be employed. Further, successful semiconductor transistor switches were made utilizing a mass-of-metal, such as tin, having a neutral doping characteristic.

In applying the mass-of-metal 15 in the embodiment described, it was alloyed with the germanium so that the indium mass-of-metal 15 and the germanium second base element 14 are in such intimate contact that the minority carriers flow freely from the mass-of-metal 15 to the second base element 14. This intimate contact is essential in applying the mass-of-metal by any means, whether it carry doping materials having the same characteristic as the doping impurity in the second base member 14 or has a neutral characteristic.

The structure illustrated in FIG. 1 still has extending around the outside of the blank or wafer 10 a layer 12 doped with an N-type impurity. This, of course, would short-circuit the structure, if it was attempted to use it as shown in FIG. 1. However, only a part of this layer, as pointed out hereinbefore, directly below emitter 13 and forming junction 16, constitutes the first base element 12 and must not be disturbed or removed.

The next step in the process is to apply masking material to the essential elements such as the emitter 13 and mass-of-metal 15 and then etch the end portions of layer 12 doped with an N-type impurity to remove them down to the dotted lines 18 and 19 and to the sides of the mass-of-metal 15. When the etching process has been completed, there will remain an operable semiconductor transistor switch unit as shown in FIG. 2.

As previously mentioned, the unnecessary portions of the layer 12 may be removed either before or after the application of the mass-of-metal 15. When the layer 12 is removed before the mass-of-metal is alloyed directly to the second base 14, there is no problem of checking to be sure that the layer 12 has been penetrated during the alloying operation.

The etching operation may be effected by the use of any suitable etching solution. A nitric-hydrofluoric acid etching solution has been used successfully.

When the structure, shown in FIG. 2, has been completed, provision will be made for mounting it and making electrical connection. A finished structure is shown in FIG. 3. In the embodiment of the invention illustrated in FIG. 3, a layer of silver 20 providing a terminal member is evaporated on and fused to the aluminum containing P-type emitter 13. This layer of silver 20 is provided to facilitate the soldering of suitable copper conductors or terminal members to the transistor switch.

In order to mount the semiconductor transistor switch in apparatus with which it is to be utilized, a suitable mounting member 21 is provided. In this instance, a mounting member 21, comprising, for example a nickel cobalt-iron alloy known as Kovar, is provided and is either fused to or soldered to the mass-of-metal 15. This alloy is a satisfactory electrical conductor. Mounting member 21 also serves to dissipate heat produced during use of the transistor. A terminal member or binding post 22 is provided on the mounting member 21 for receiving an electrical conductor.

In addition to the terminal members 20 and 22, a ring base contact 23 is fused to the first base member 12 to provide a low resistance non-rectifying electrical contact. The ring base contact 23 may be made from some suitable metal such as silver or tin, or an alloy of silver and tin. The ring base contact 23 should have a low resistance, since electrical currents will be conducted through it to the first base member 12. Silver or an alloy of silver and tin is preferable for making ring contact 23, since it is relatively easy to solder electrical conductors to either of these. In applying the ring contact 23, care must be observed in either fusing or soldering it to the first base member to avoid penetrating through the base member 12

The structure illustrated in FIG. 3 comprises an emitter 13, a first base member 12, a second base member 14 and a mass-of-metal 15 in intimate contact with the second base member 14. In addition, there are provided two terminal members 20 and 22 for making electrical connection with the emitter 13 and mass-of-metal 15, respectively. The ring base contact 23 provides for making electrical contact with the first base element 12.

The embodiment of the invention described in detail hereinbefore comprises a germanium crystal or blank to which elements are added to make a PNP structure plus a mass-of-metal. A silicon crystal may be utilized instead of a germanium crystal. When a silicon crystal is utilized, the same doping materials may be employed as with germanium.

In the description given hereinbefore, a PNP structure built around a germanium blank 10 which was doped in the growing process with a P-type impurity and which had added to it a mass-of-metal having a doping characteristic either conforming to the second base member 14 or a neutral characteristic was set forth in some detail. An NPN transistor switch may be made by following the same procedure with the exception that a blank 10 of either germanium or silicon doped with antimony or the like in growing to give it N-type characteristics will be employed. When a blank 10 doped to give it an N-type characteristic is employed, the emitter 13 will also comprise an N-type doping impurity, and the first base element 12 will be doped with an impurity which gives it a P-type characteristic. In this case, the mass-of-metal 15 applied to the second base element 14 will be selected to have either an N-type doping or a neutral characteristic.

When an NPN structure is connected into a circuit and energized, the minority carriers in the mass-of-metal 15 will be holes which will flow toward the collector junction 16. The electrons will flow from the N-type emitter through the first base element to the collector junction.

In making semiconductor transistor switches of the PNP type such as described hereinbefore, many different metals and alloys were employed as the mass-of-metal 15. The mass-of-metal 15 is selected to have either a doping characteristic corresponding to the carrier characteristic of the second base 14 which it contacts or a neutral characteristic.

The following metals and alloys have been employed successfully as the mass-of-metal 15 in making transistor switches:

(1) pure indium
(2) pure tin
(3) 1% gallium and the remainder indium
(4) 10% gold, 3% aluminum and the remainder silver
(5) 3% aluminum, 10% silver and the remainder indium
(6) 5% indium and the remainder tin
(7) 5% indium, 2% aluminum and the remainder tin
(8) 10% aluminum, 20% silver and the remainder indium
(9) 10% aluminum, 30% silver and the remainder indium
(10) 10% silver, and the remainder indium Many other compositions may be prepared which can be utilized successfully as metal-mass 15. In preparing such compositions, the rule is to provide a mass-of-metal which will serve as a suitable source of minority carriers.

The emitter junction 17 should be disposed well within a diffusion length of the collector junction 16. The first base 12 should have such carrier characteristics and be of such dimensions that a high proportion of all the carriers injected by the emitter will reach the collector junction. Further, since the mass-of-metal 15 when energized is a source of minority carriers which cooperate in rendering the transistor switch highly conductive, attention must be given to its location relative to the collector junction 16. Therefore, the interface surface 9 of the mass-of-metal 15 with the second base, generally is located within a diffusion length of the collector junction 16 to assure that there is an adequate flow of minority carriers to the collector junction. When carriers reach the collector junction 16 at a predetermined rate, it becomes highly conductive.

As is well known in the art, a diffusion length is the measure of distance a predetermined proportion of minority carriers will travel before absorption or trapping. Therefore, the mass-of-metal 15 must be so located that an adequate number of minority carriers will reach the collector junction. In many cases, the distance to the collector junction has been substantially less than a diffusion length. However, good results may be obtained when the distance comprises several diffusion lengths; for instance, the number of diffusion lengths may be of the order of 2 to 10.

The minority carrier is an electron in P-type material and a hole in N-type material. The minority carriers must reach the collector junction at a predetermined rate to effect breakdown or the rendering of the transistor highly conductive. When PNP or NPN structures comprise an emitter, two base elements and a mass-of-metal, which serve as a plentiful source for injection of minority carriers which will flow readily on energization, efficient functioning of the transistor switch is assured.

Figure 4:
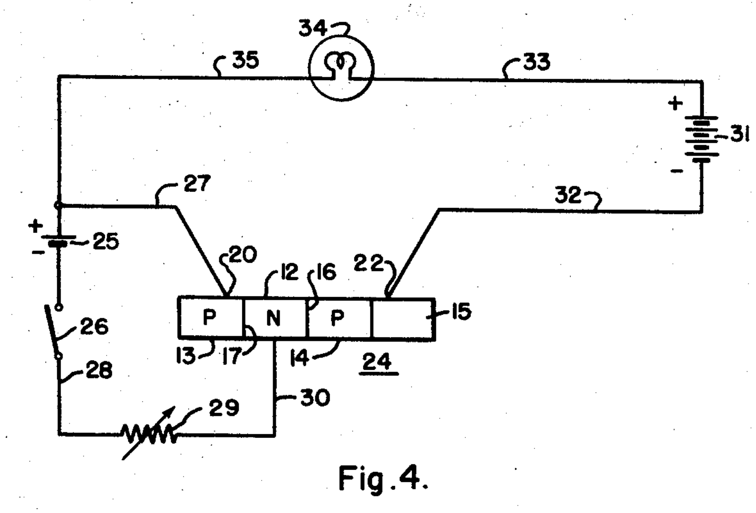
FIG. 4 is a circuit diagram showing a simple circuit to illustrate how the transistor switch may be utilized for performing switching operations.

Referring now to FIG. 4, the semiconductor transistor switch shown diagrammatically at 24 is connected into a simple electrical circuit to aid in describing how it operates. As illustrated, a biasing circuit is connected across the emitter 13 and first base element 12. The biasing circuit comprises a source of power 25, which in this instance may be a battery, capable of delivering electrical current at a potential of about 1½ volts between its terminals. A manually operable switch 26 connected to one terminal of the battery is provided for controlling the circuit. The other terminal of the battery 25 is connected through conductor 27 to the terminal 20 on the emitter 13. The free end of the switch 26 is connected through conductor 28 to a variable resistor 29 which in turn is connected through a conductor 30 to the first base element 12. When the switch 26 is closed, a biasing voltage is impressed across the emitter 13 and the first base element 12.

A second source of power, which is also illustrated as a battery 31 capable of delivering 45 volts, is connected across the emitter 13 and mass-of-metal 15. One terminal of the battery 31 is connected through conductor 32 to the terminal 22 on the mass of metal. The other terminal of the battery 31 is connected through conductor 33, light 34 and conductor 35 to conductor 27 of the base biasing circuit.

When the switch 26 is closed, a voltage is impressed across the emitter 13 and base 12. The current which will flow may be controlled by the variable resistor 29. When a predetermined base current flows (see curves of FIG. 5), the transistor switch becomes highly conductive, and an amplified current flows in the emitter-mass-of-metal circuit from battery 31 through conductor 33, lamp 34, conductors 35 and 27, emitter 13, emitter junction 17, first base 12, collector junction 16, second base 14, mass-of-metal 15 and conductor 32 back to the battery 31.

In a semiconductor transistor switch of this kind the voltage at which it becomes highly conductive can be controlled by controlling the biasing voltage applied across the emitter and first base element and therefore the current flow through the emitter junction. It has been found in tests that by causing currents measured in milliamps to flow in the first base circuit, currents measured in amperes will flow in the emitter-mass-of-metal circuit. This results in a high current amplification.

Figure 6:
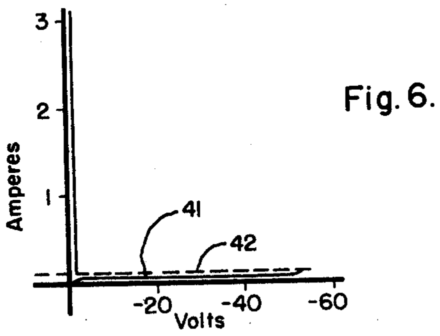
FIG. 6 is a graph showing a characteristic breakdown curve of a transistor switch embodying the features of the invention.

As shown in FIG. 6, the transistor switch is highly resistant to the flow of current when reverse voltages below the breakdown voltage are impressed across the emitter and mass-of-metal members. The transistor switch for which the curve 41 was plotted had no current applied to the base contact by the biasing circuit, and it became highly conductive when a potential of −55 volts and about one milliampere of current was applied, such that the voltage dropped along line 42 to a value of one volt at which it supported a relatively high current flow in amperes. Thus, the transistor switch when subjected to predetermined operating conditions abruptly becomes a conductor with low ohmic resistance. The transistor switch described will respond to different operating conditions. When connected in a circuit, the voltage impressed across the emitter 13 and mass-of-metal 15 and the biasing current delivered through the first base cooperate in rendering the semiconductor transistor switch highly conductive at a selected reverse current and voltage. As the base biasing current is increased, the reverse voltage at which the transistor switch becomes highly conductive becomes lower, while if the base biasing current is decreased, the voltage at which it becomes highly conductive is increased. Thus, by varying the base biasing current, the breakdown voltage can be controlled.

Figure 5:
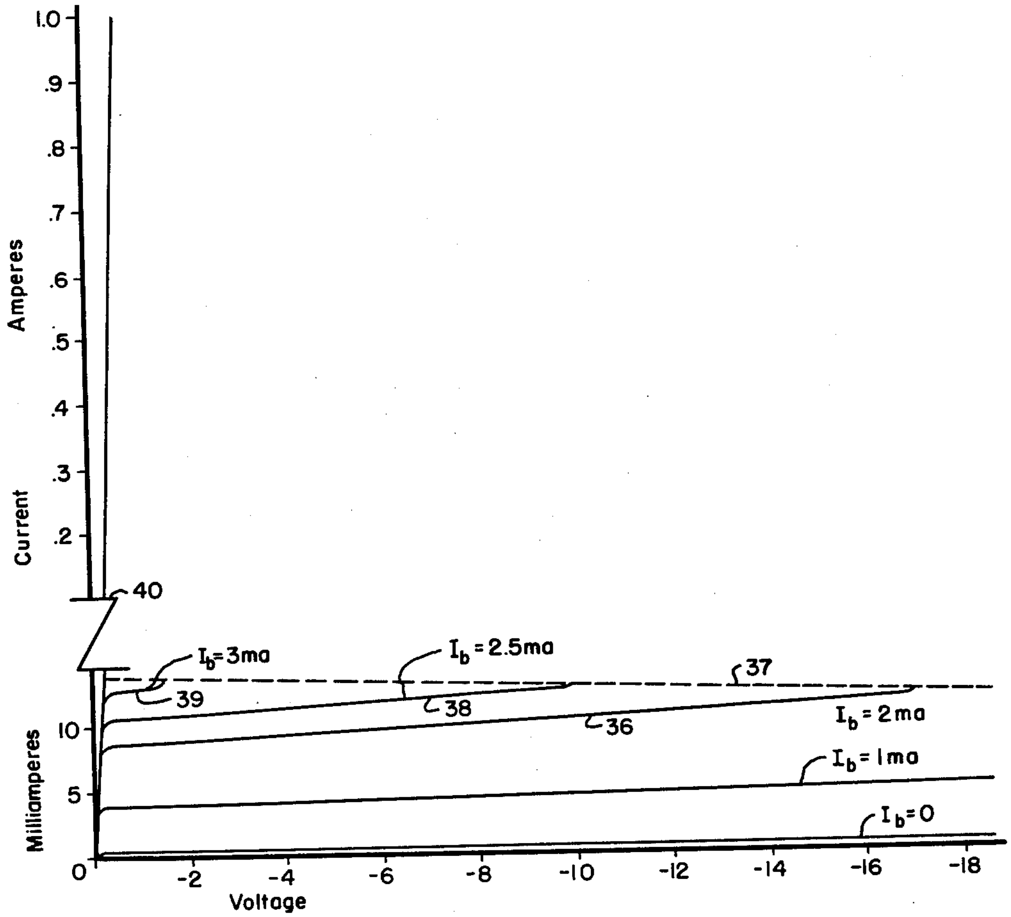
FIG. 5 is a graph, plotting voltage against amperage, with a set of curves for various test conditions showing the results obtained in testing a transistor switch embodying the features of the invention.

The curves illustrated in FIG. 5 give a good picture of how the semiconductor transistor switch functions. Consider, for example, the curve 36 which illustrates that when a base current of two milliamps is caused to flow, the transistor switch will become highly conductive when subjected to minus 17 volts across the emitter 13 and mass-of-metal 15. When the collector junction becomes highly conductive, the voltage drops along the line 37 to less than ½ volt. Current of the order of 1 ampere may be built up and maintained by minus 1 volt. This rendering of the semiconductor transistor switch highly conductive, which is in effect a switching operation, occurs in less than one-tenth of a microsecond.

If the current in the base circuit, as illustrated in curve 38 is increased to 2.5 milliamps, the transistor switch becomes highly conductive under a voltage of minus 10 volts across the emitter 13 and mass-of-metal 15. When the collector junction becomes highly conductive, the voltage drops to about minus ½ volt, and the current in the emitter-mass-of-metal circuit builds up to about 1 ampere at minus one volt across the transistor switch. It has been found that currents of 10 to 15 amperes can be sustained with less than minus 5 volts across the transistor switch. Definitely higher currents can be sustained with higher voltages and changes in design.

Curve 39 reveals that if the base current is 3 milliamps, that the transistor will break down at about 1½ volts, and that the current through the transistor switch can be sustained at about 1 ampere at minus one volt. As pointed out hereinbefore, the breakdown voltage of the semiconductor transistor switch can be controlled by varying the current flow in the base circuit. The control of the current flow in the base biasing circuit can be effected through any suitable means, for example, the variable resistor 29. When the transistor has become highly conductive, the flow of current may be maintained with a very small voltage. This combination of features means that very accurate control can be established, and current flow through the transistor switch can be maintained with very small voltages. Therefore, the transistor switch can be operated with very small power loss.

The Z-shaped figure 40 in the curve has been employed to indicate a change in scale from the portion of the ordinate calibrated in milliamps to the portion calibrated in amperes.

The making and the functioning of a semiconductor transistor switch of this invention are set forth in the following specific structure. In order to meet predetermined specifications, a germanium crystal wafer 10 about 0.25 inch in diameter and from 0.005 inch to 0.007 inch thick was prepared. This crystal was doped with arsenic, an emitter and a mass-to-metal were applied, and it was etched in accordance with the information given hereinbefore. When finished, the N-type base 12 was about 0.1 inch in diameter and 0.0002 inch thick. The P-type base 14 was about ¼ inch in diameter and from 0.003 to 0.005 inch thick. The mass-of-metal 15 was of the same diameter as the base 14 and 0.004 inch thick. While these dimensions will give a fair idea of the size of the structure, it is to be understood that in order to meet different specifications and operating conditions, these dimensions may be varied to meet any requirements. The embodiments of the invention described hereinbefore were made from germanium and silicon with selected doping materials. This was not intended to be a limitation but illustrative of suitable semiconductor materials.

The semiconductor transistor switch can also be made from stoichiometric compounds of the elements of groups III and V of the periodic classification such as indium arsenide, indium antimonide, and aluminum phosphide. The application of transistor switches embodying the features of the present invention are numerous. Fundamentally, it is a transistor switch that may be employed for performing switching operations generally. There are many obvious applications in the art, as for example in electronic systems and certain other fields where applications may be made by those aware of the specific problems.

Since certain changes may be made in the above article and different embodiments of the invention could be made without departing from the scope thereof, it is intended that all matter contained in the above description or shown in the accompanying drawing should be interpreted as illustative and not in a limiting sense.

I claim as my invention:

In a semiconductor switch having one condition of a high resistance to the flow of electrical current and a controlled relatively abrupt change to a highly conductive state, the switch comprising four joined layers, the first and uppermost layer being a semiconductor material having a first type of semiconductivity, the second layer being larger in area than said first layer and comprising a semiconductor material of opposite type of semiconductivity, the second layer and said first layer being joined to provide an emitter junction therebetween, the surface of the second layer being exposed completely around the first layer, a ring-shaped ohmic contact encircling the first layer and joined to the exposed surface of the second layer, a third layer of semiconductor material having the first type of semiconductivity and joined to the other surface of the second layer to provide a collector junction therebetween, a fourth layer joined to the third layer to provide means for introducing minority carriers to the third layer when a potential is applied thereto reverse with respect to the collector junction, the distance from the surface where the fourth layer is applied to the third layer being within one diffusion length from the collector junction, and ohmic contact means being applied to the first layer and to the fourth layer, whereby only three electrical leads can be applied to the switch.

References Cited in the file of this patent

UNITED STATES PATENTS

| | | |
|---|---|---|
| 2,623,105 | Shockley et al. | Dec. 23, 1952 |
| 2,655,608 | Valdes | Oct. 13, 1953 |
| 2,655,610 | Ebers | Oct. 13, 1953 |
| 2,709,787 | Kircher | May 31, 1955 |
| 2,813,817 | Leverenz | Nov. 19, 1957 |
| 2,829,422 | Fuller | Apr. 8, 1958 |
| 2,855,524 | Shockley | Oct. 5, 1958 |
| 2,877,358 | Ross | Mar. 10, 1959 |
| 2,890,353 | Van Overbeek et al. | June 9, 1959 |
| 2,905,836 | Herold | Sept. 22, 1959 |
| 2,953,693 | Philips | Sept. 30, 1960 |

OTHER REFERENCES

Miller and Ebers: "Alloyed Junction Avalanche Transistors" Bell System Technical Journal, vol. 34, September 1955, pp. 883–902.

J. L. Moll et al.: "PNPN Transistor Switches" Proceedings of the IRE, vol. 44, September 1956, pp. 1174–1182.